United States Patent [19]

Sallaerts et al.

[11] Patent Number: 4,860,230

[45] Date of Patent: Aug. 22, 1989

[54] SIGNAL RECOGNITION SYSTEM

[75] Inventors: Daniel Sallaerts, Aarschot; Michel C. A. R. Rahier, Boechout, both of Belgium

[73] Assignee: Alcatel N.V., Amsterdam, Netherlands

[21] Appl. No.: 99,706

[22] Filed: Sep. 21, 1987

Related U.S. Application Data

[63] Continuation of Ser. No. 679,678, Dec. 7, 1984, abandoned.

[30] Foreign Application Priority Data

Dec. 22, 1983 [BE] Belgium ............................ 2/60299

[51] Int. Cl.$^4$ ...................... G01R 29/02; H04J 3/12; H03K 5/22
[52] U.S. Cl. ..................................... 364/569; 364/486; 370/110.1; 377/20; 379/286; 328/129.1; 307/234
[58] Field of Search ................. 364/569, 486; 379/377, 379/378, 382-385, 294, 255, 252, 286, 386, 283; 370/110.1, 110.2; 340/365 E; 371/62; 307/234, 265, 47; 377/20, 26; 328/58, 111, 120, 129.1

[56] References Cited

U.S. PATENT DOCUMENTS

| | | | |
|---|---|---|---|
| 3,980,833 | 9/1976 | Calcagno et al. | 179/18 FG |
| 4,002,849 | 1/1977 | Kotler et al. | 179/18 FG |
| 4,176,256 | 11/1979 | Fruth et al. | 179/18 FG |
| 4,303,983 | 12/1981 | Chaborski | 364/569 |
| 4,348,758 | 9/1982 | Sutherland | 370/110.2 |
| 4,370,618 | 1/1983 | Walker | 328/120 |
| 4,392,065 | 7/1983 | Stiglich | 340/365 E |
| 4,427,948 | 1/1984 | Rinaldi | 328/120 |
| 4,446,437 | 5/1984 | Rinaldi | 328/120 |
| 4,471,235 | 9/1984 | Sakhuja et al. | 307/471 |
| 4,491,944 | 1/1985 | Caizergues et al. | 370/110.1 |
| 4,517,669 | 5/1985 | Freeburg et al. | 370/110.1 |
| 4,519,090 | 5/1985 | Stackhouse et al. | 371/62 |
| 4,523,289 | 6/1985 | Soma et al. | 364/569 |
| 4,538,235 | 8/1985 | Henning | 364/569 |
| 4,570,260 | 2/1986 | Basehore | 370/110.2 |

FOREIGN PATENT DOCUMENTS

| | | | |
|---|---|---|---|
| 880921 | 6/1980 | Belgium. | |
| 1016637 | 8/1977 | Canada | 371/62 |
| 2250233 | 5/1976 | France. | |
| 1475199 | 6/1977 | United Kingdom. | |

OTHER PUBLICATIONS

Lettieri, "Noise-Reject Communication Line Interface", IBM Technical Disclosure Bulletin, vol. 5, No. 8, Jan. 1983, pp. 35-37.
Electrical & Electronics Abstracts, vol. 85, No. 1018 (Oct. 1982): "One IC Debouces Six Switches", V. Regener, EDN, vol. 27, No. 6, p. 180 (17 Mar. 82) (Abstract only).
Foreign Patent Document (Abstract Only), 880,921, 28 Jun. 1980, Belgium, (Eng. Translation of Abstract).

Primary Examiner—Parshotam S. Lall
Assistant Examiner—Joseph L. Dixon
Attorney, Agent, or Firm—Christie, Parker & Hale

[57] ABSTRACT

A signal persistence time interval recognition system reproduces a condition of an input signal as a condition of an output signal only when the input signal condition persists for at least a predetermined time interval. The system periodically scans the input signal condition and has a first memory (ROM) for storing a start value indicative of the time interval. A second memory (RAM) stores a value indicative of the time counted since the detection of a difference between the input and output signal conditions. A third memory stores the output signal condition and a processor brings the start value from the first memory into the second memory when no difference is detected. The processor modifies the value in the second memory each time such a difference is detected and until a value is reached indicating that the time interval has been counted, the output signal condition in the third memory being then changed. The first memory only stores a single start value for all conditions of the input signal and the processor perform the modification in the second memory independently of the first memory.

13 Claims, 6 Drawing Sheets

SIGNAL RECOGNITION SYSTEM

CROSS-REFERENCE TO RELATED APPLICATIONS

This is a continuation of application Ser. No. 679,678, filed Dec. 7, 1984, now abandoned.

BACKGROUND OF THE INVENTION

The present invention relates to a signal recognition system for reproducing a condition of an input signal as a condition of an output signal only when said input signal condition persists for at least a predetermined time interval, said system including a means for periodically scanning said input signal condition; a first memory means for storing a start value indicative of said time interval; a second memory means for storing a value indicative of the time already counted since the detection of a difference between said input and output signal conditions; a third memory means for storing the output signal condition; and a processing means for bringing said start value from said first memory means into said second memory means when no difference is detected and for modifying the value in said second memory means each time such a difference is detected and until a value is reached indicating that said time interval has been counted, said output signal condition in said third memory means being then changed.

Such a system is already known from the Belgian Pat. No. 880 921 (D. DE BAETS 1). In this known system the first memory means stores for each input signal condition a start value for the count down as well as a series of next values each decreased by one. These start and next values are successively brought in the second register means when a difference is detected between an input signal condition and an output signal condition and until the value stored in the second register means indicates that a required time interval had been counted, i.e. until the end of the count down has been reached. Hence, the first memory means is relatively large and each time a value stored in the second memory means has to be modified, the first memory means has to be accessed to obtain a next value. Moreover, for such an operation the real condition of the input signal has to be known since the next value is function of this condition.

An object of the present invention is to provide a signal recognition system of the above type, but which does not present these drawbacks.

According to the invention this object is achieved due to the fact that said first memory means only stores a single start value for all conditions of said input signal and that said processing means perform said modification in said second memory means indpendently of said first memory means.

Hence, the first memory means is relatively small and has not to be accessed each time the value stored in the said memory means has to be modified.

Another characteristic feature of the present system is that it includes an adder circuit whose sum output is coupled to an input of said second memory means, and an exclusive-OR gate which compares said input and output signal conditions and which when the result of this comparison indicates a difference couples an output of said second memory means to said adder circuit which then adds a 1 to the value stored in said second memory means.

Hence the modification of the value stored in the second memory means is performed by a simple adding operation and independently of the real condition of the input signal. The speed of such adding operation being relatively low, the present system may be integrated on a relatively small surface. Indeed, when for instance MOS technology is used wherein data transfer is realized by the charge and discharge of parasitic capacitances, a relatively low speed permits the use of transistors which provide relatively small currents to perform these charge and discharge operations and which may therefore be integrated on a relatively small surface.

The above mentioned and other objects and features of the invention will become more apparent and the invention itself will be best understood by referring to the following description of an embodiment taken in conjunction with the accompanying drawings in which:

DESCRIPTION OF THE PREFERRED EMBODIMENT

The present signal recognition or debouncing system forms part of a telephone system and is used therein to debounce 8 telephone signals. Examples are the on hook/off hook signals and the ring trip signals. These 8 telephone signals IN0 to IN7 are applied to like named inputs IN0 to IN7, and the debounced output signals are provided at the outputs OUT0 to OUT7.

Figure 1:
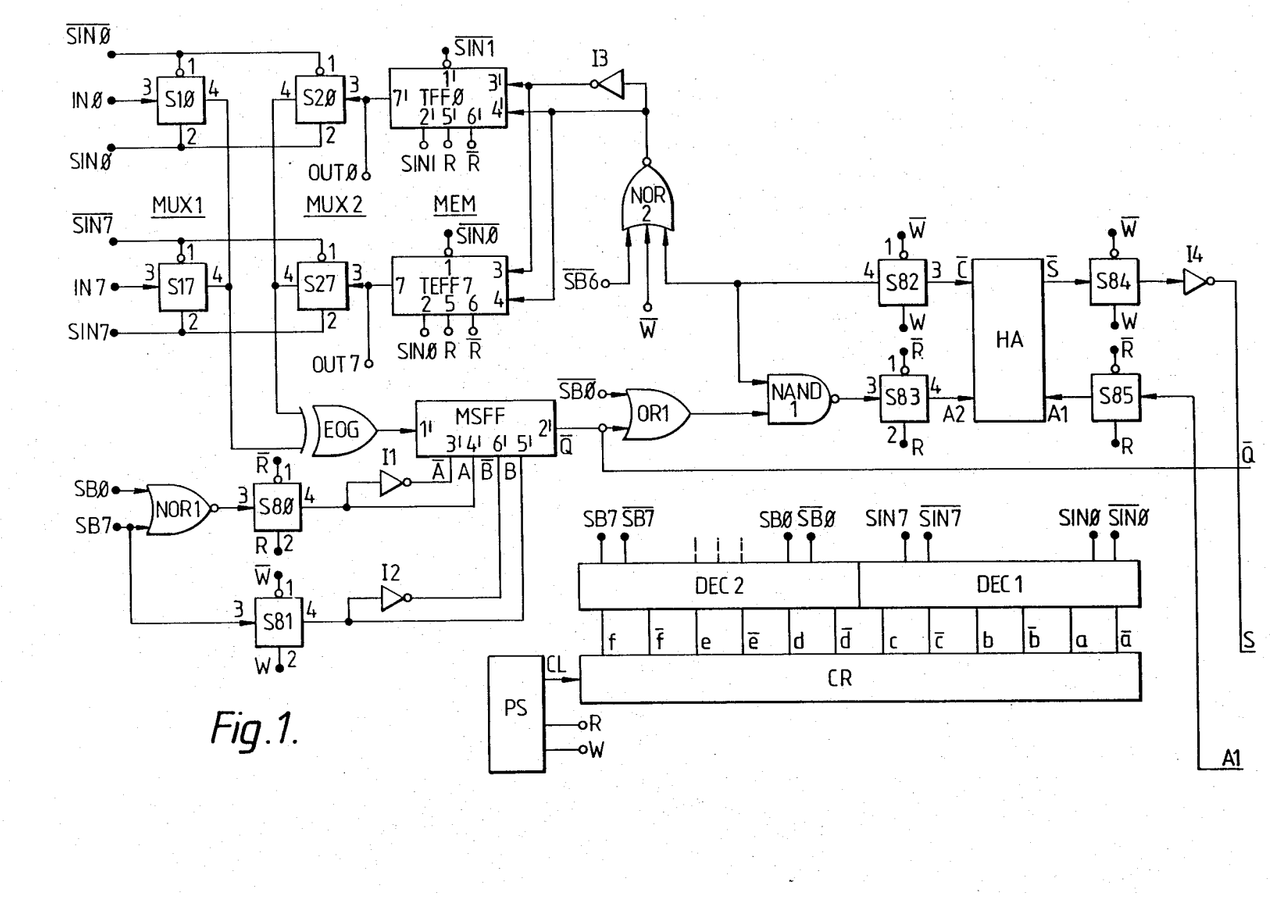
FIGS. 1 and 2 arranged next to each other represent a signal recognition system according to the invention.
Figure 2:
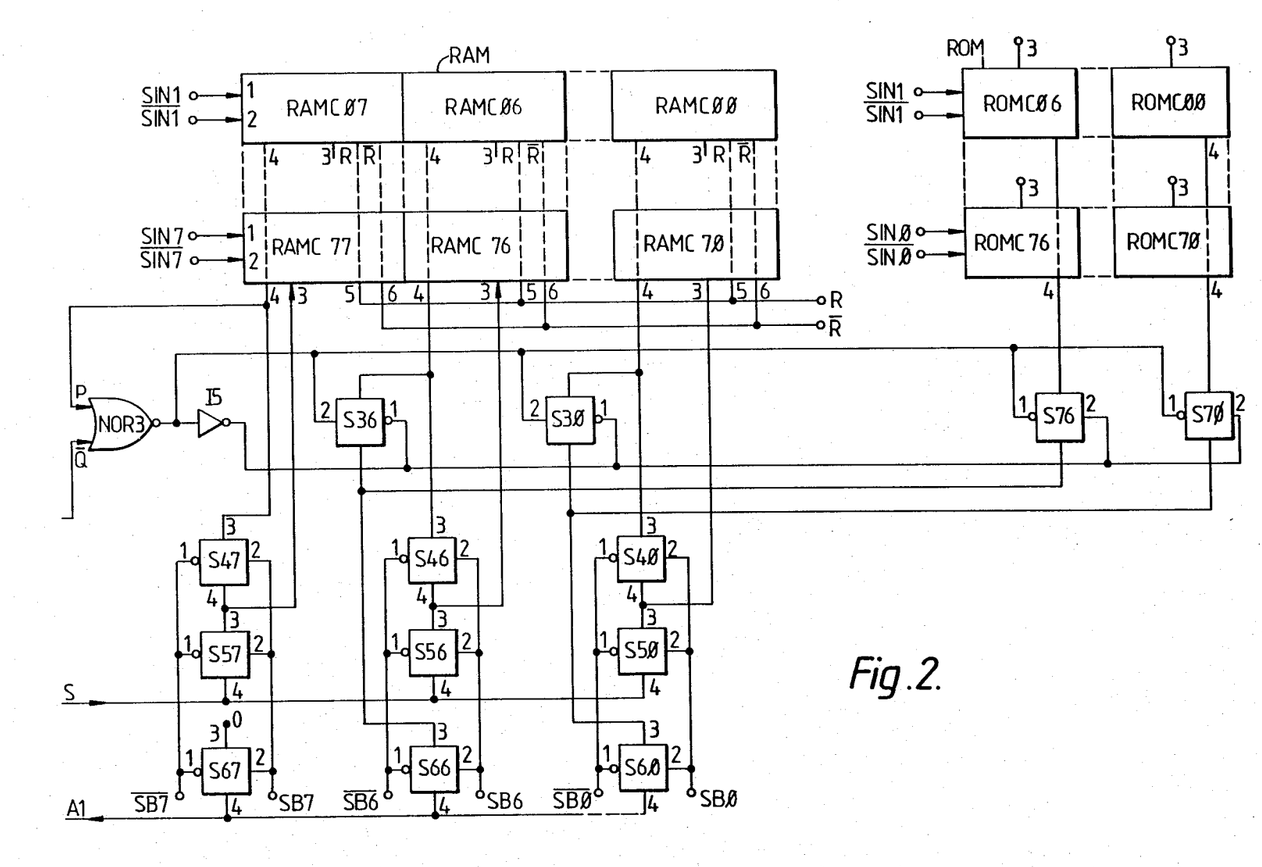
Figure 3:
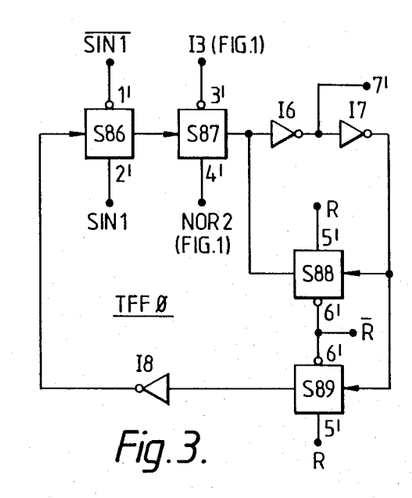
FIGS. 3, 4 and 5 show TFF0, MSFF and HA of FIG. 1 in more detail respectively.
Figure 4:
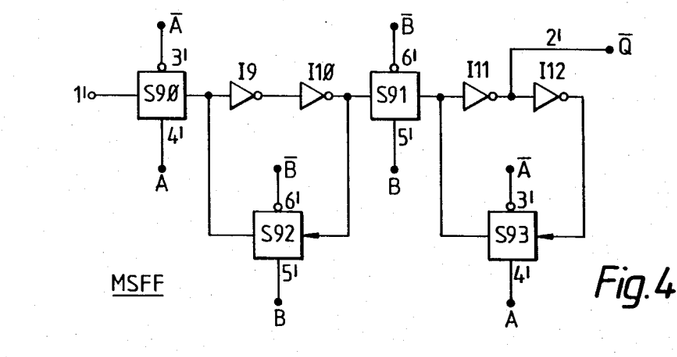
Figure 5:
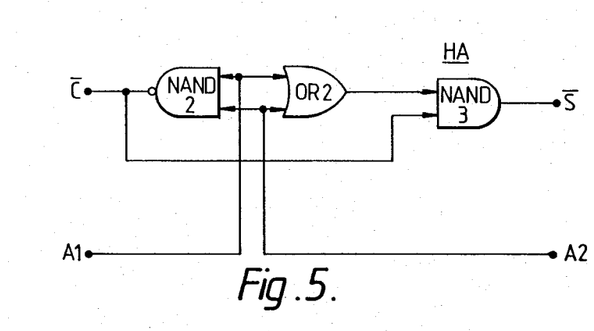
Figure 6:
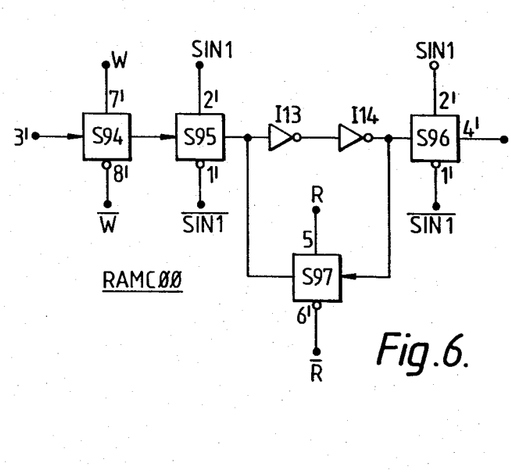
FIGS. 6 and 7 respectively represent a cell RAMC00/77 of RAM and a cell ROMC00/76 of ROM of FIG. 2 in more detail.
Figure 7:
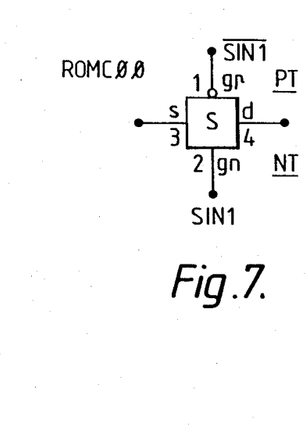
Figure 9:
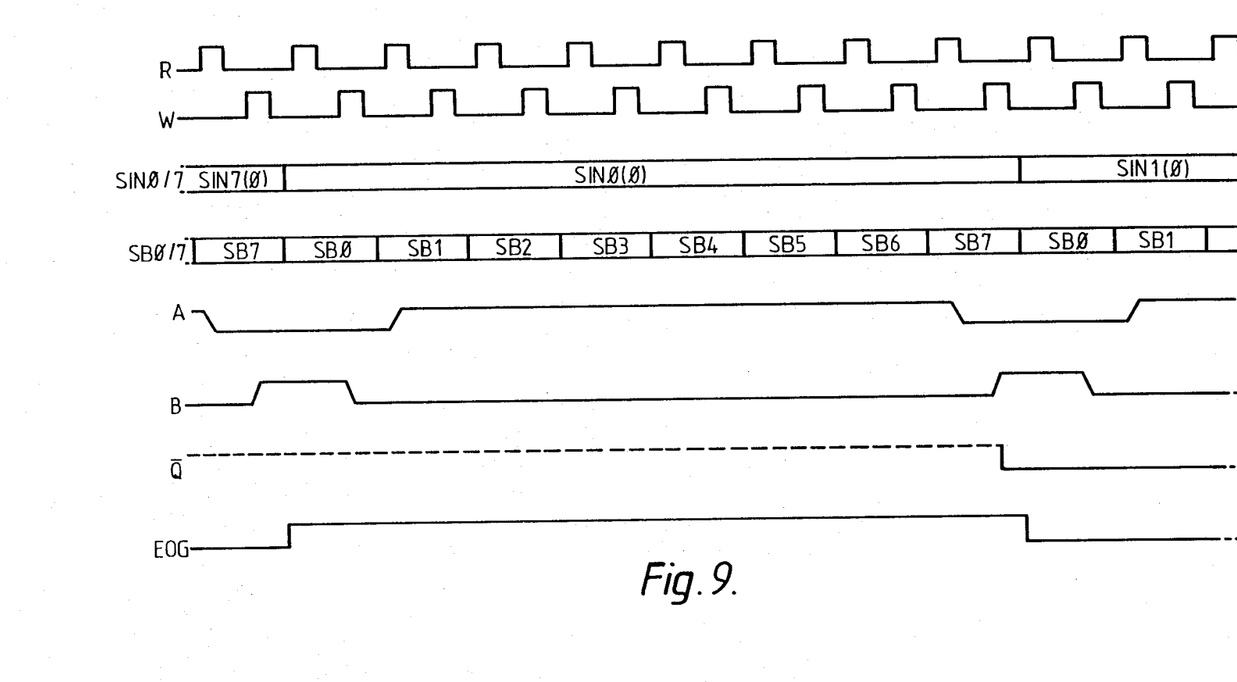
FIG. 9 represents pulse waveforms occurring at various points of the system of FIGS. 1 and 2.

This debouncing system includes the following circuits which are interconnected as shown:

a pulse source PS (FIG. 1) providing a clock signal CL (not shown) and read and write signals R and W (FIG. 9) all having a period equal to 2 ms/64, R and W being phase shifted by 180°;

a well known binary counter CR (FIG. 1) having complementary binary outputs a, $\bar{a}$ to f, $\bar{f}$, a, $\bar{a}$ and f, $\bar{f}$ being the most and least significant bits respectively. This counter CR is fed from clock signal CL and provides at its outputs a, b, c ($\bar{a}$, $\bar{b}$, $\bar{c}$) and d, e, f ($\bar{d}$, $\bar{e}$, $\bar{f}$) a different 3-bit output signal every 2 ms/8 and every 2 ms/64 respectively;

a well known binary-to-decimal decoder circuit DEC1 (FIG. 1) which decodes every 3-bit input signal a, b, c ($\bar{a}$, $\bar{b}$, $\bar{c}$) into 1-out-of-8 so-called select input signals SIN0/7 ($\overline{SIN0/7}$), shown in FIG. 9, each defining an input time interval of 2 ms/8;

a well known binary-to-decimal decoder circuit DEC2 (FIG. 1) which decodes every 3-bit input signal d, e, f ($\bar{d}$, $\bar{e}$, $\bar{f}$) into 1-out-of-8 so-called select bit signals or bit time periods SB0/7 ($\overline{SB0/7}$), shown in FIG. 9, each defining a bit period of 2 ms/64;

a multiplexer MUX1 (FIG. 1) comprising switches S10 to S17;

a multiplexer MUX2 (FIG. 1) comprising switches S20 to S27;

a memory MEM (FIG. 1) comprising toggle flipflops TFF0 to TFF7 each comprising switches S86 to S89 and inverters I6 to I8 (FIG. 3);

a master/slave flipflop MSFF (FIG. 1) comprising switches S90 to S93 and inverters I9 to I12 (FIG. 4);

a half adder HA (FIG. 1) comprising NAND gates NAND2 and NAND3 and OR gate OR2 (FIG. 5);

a RAM (FIG. 2) with memory cells RAMC00 to RAMC77 each comprising switches S94 to S97 and inverters I13 and I14 (FIG. 6).

a ROM (FIGS. 2, 8) with memory cells ROMC00 to ROMC76 each comprising a switch (FIG. 7);

a ROM control circuit HTC (FIG. 8) comprising NOR gates NOR4 and NOR5, AND-gate AND, NAND gate NAND4 and inverters I15 and I16;

NAND gate NAND 1 (FIG. 1);

OR gate OR1 (FIG. 1);

NOR gates NOR1, NOR2 (FIG. 1) and NOR3 (FIG. 2);

Exclusive-OR gate EOG (FIG. 1);

inverters I1 to I4 (FIG. 1) and I5 (FIG. 2);

switches S30 to S36, S40 to S47, S50 to S57, S60 to S67, S70 to S76 (FIG. 2) and S80 to S85 (FIG. 1);

Each of the above mentioned switches is of the type S shown in FIG. 7 and comprises an N-channel MOSFET NT with source electrode s or 3, drain electrode d or 4 and gate electrode gn or 2 and a P-channel MOSFET PT with the same source and drain electrodes and with a gate electrode gp or 1. To indicate that PT and NT become conductive when a 0 and a 1 is applied to their gate electrodes respectively, PT is represented with an inverter at its gate gp. Switch S is well known in the art and is such that an input voltage at the source electrode 3 appears at the drain electrode 4 and vice-versa when the complementary signals such as SIN1 and $\overline{SIN1}$ applied to the gates gn and gp are 1 and 0, because both NT and PT then become conductive.

To be noted that when a switch is closed the state of its input appears at its output and thereby charges or discharges the wire capacitance connected to this output depending on the input being 1 or 0. This charge temporarily remains for a time period of about 2 ms even when the switch is opened.

Multiplexer MUX1 comprises switches S10/17 to the electrodes 1, 2 and 3 of which the select input signals $\overline{SIN0/7}$, SIN0/7 and the input signals IN0/7 are applied respectively. The drain electrodes 4 of all these switches are connected in common to one input of the exclusive-OR gate EOG. The purpose of MUX1 is to successively apply the input signals IN0/7 to the one input of EOG under the control of the select input signals SIN0, $\overline{SIN}$ to SIN7, $\overline{SIN7}$ which control the switches S10 to S17 respectively.

Multiplexer MUX2 comprises switches S20/27 to the electrodes 1, 2 and 3 of which the select input signals $\overline{SIN0/7}$, SIN0/7 and the output signals of TFF0/7 of MEM are connected respectively. The drain electrodes 4 of these switches are connected in common to the other input of EOG whose output is connected to the data input 1' of the master/slave flipflop MSFF. The purpose of MUX2 is to successively apply the signals stored in TFF0/7 to the other input of EOG under the control of the select input signals SIN0, $\overline{SIN0}$ to SIN7, $\overline{SIN7}$. As a consequence EOG compares each pair of input and output signals applied to it and stores a 1 in MSFF if these signals are different.

Each of the toggle flipflops TFF0/7 is of the same type and therefore only TFF0 is shown in FIG. 3. It comprises a first loop including the cascade connection of inverters I6, I7 and switch S88 and a second loop comprising inverters I6, I7, switch S89, inverter I8 and switches S86 and S87 in cascade. It has select inputs 1' and 2', data inputs 3' and 4', read inputs 5' and 6' and output 7' which are constituted by the gate electrodes of S86; S87; S88, S89 and by the output of I6 respectively. The select inputs 1' and 2' of S86 are controlled by $\overline{SIN1}$ and SIN1 respectively; the data inputs 3' and 4' of S87 are controlled by the output signals of I3 and NOR2 shown in FIG. 1 respectively. The read inputs 5', 6' are controlled by the read signals R and $\overline{R}$ respectively, R being represented in FIG. 9.

Each toggle flipflop stores a previous state in the parasitic input capacitance of the inverters I6 and I7. When no new data is applied to its data inputs 3' and 4', i.e. when the data signals NOR2 and I3 are 0 and 1 respectively, switch S87 is open so that independently of the flipflop being selected or not (S86 closed or not) this previous state is circulated in the first loop at each occurrence of the read pulses R and $\overline{R}$. In this case the stored previous state thus undergoes no modification. On the contrary, when new data are applied to the data inputs 3' and 4' which are then on 0 and 1 respectively and when the flipflop TFF0 is selected by SIN1, $\overline{SIN1}$, switches S87 and S86 are both closed. The previous state appearing at the output of the first loop, i.e. at the junction point of I7 and S88, is then applied to the input of this loop at the junction point of I6 and S87, via S89, I8, S86 and S87 at the moment R and $\overline{R}$ close switch S89. In this way the previous state is inverted by I8 and applied to the first loop wherein it is stored and then again circulated. Thus TFF0 has been basculated.

The master/slave flipflop MSFF is represented in detail in FIG. 4 and comprises the cascade connection of switch S90, inverters I9 and I10, switch S91 and inverters I11 and I12, the inverters I9 and I10, and switch S92 being connected in a slave loop and the inverters I11 and I12 and switch S93 being connected in a master loop. MSFF has input 1', output 2' or $\overline{Q}$ and control inputs 3', 4' and 5'; 6' which are constituted by the source electrode of S90, the output of I11 and the gate electrodes of S90, S93 and S91, S92 respectively. Input 1' is connected to the output of EOG; output 2' or $\overline{Q}$ is connected to an input of OR1 (FIG. 1) and NOR3 (FIG. 2); and the control inputs 3', 4' and 5'; 6' are controlled by the pulse waveforms $\overline{A}$, A and B, $\overline{B}$ respectively. These pulse waveforms A and B shown in FIG. 9 are generated by a circuit comprising NOR gate NOR1, switches S80, S81 and inverters I1 and I2 (FIG. 1). The select bit signals SB0 and SB7 are applied to the like named inputs of NOR1 whose output is connected to the source electrode 3 of S80. SB7 is also connected to the source electrode 3 of S81. S80 and S81 are controlled by R, $\overline{R}$ and W, $\overline{W}$ respectively and provide at their outputs the pulse waveforms A and B respectively, whilst the inverted pulse waveforms $\overline{A}$ and $\overline{B}$ are provided at the outputs of I1 and I2 whose inputs are connected to the drain electrodes 4 of S80 and S81 respectively. Theoretically A=$\overline{SB0+SB7}$.R and B=SB7.W, but in practice and as shown in FIG. 9 the edges of A and B are somewhat delayed with respect to $\overline{SB0+SB7}$ and SB7 respectively, because some time is required to discharge and charge the wire capacitance at the output of S80 and S81 respectively. Moreover, due to the presence of this wire capacitance the outputs of S8∅ and S81 remains ∅ and 1 respectively as long as $\overline{SB0+SB7}$ and SB7 are ∅ and 1 respectively although the position of the switches S8∅ and S81 changes in the course of the latter signal, as shown in FIG. 9.

Each time that pulse waveform A is on, 1, S9∅ and S93 are closed so that simultaneously the state of a signal which is present at input 1′ of MSFF is applied to the input of the slave loop and stored in the input capacitances of I9, I1∅ thereof, and the state stored in the input capacitances of I11, I12 of the master loop is circulated therein. Each time the pulse waveform B is on 1, S91 and S92 are closed so that the state stored in the above slave loop is simultaneously circulated in this loop and applied to the master loop wherein it is stored and circulated when afterwards A is again on 1. This means that the signal stored in the slave loop appears at the output 2′ or $\overline{Q}$ of MSFF when the leading edge of B becomes 1, as shown in FIG. 9.

The half adder HA is shown in detail in FIG. 5 and has adder terminals A1 and A2, an inverse sum terminal $\overline{S}$ and an inverse carry terminal $\overline{C}$. It comprises NAND gates NAND2 and NAND3 and OR gate OR2. Adder signals A1 and A2 are applied to the input of NAND2 and of OR2, NAND2 provides the inverse carry signal $\overline{C}$ at its output and this signal $\overline{C}$ and the output signal A1+A2 of OR2 are applied to the inputs of NAND3 which provides signal $\overline{S}$ at its output. The inverse sum and carry signals $\overline{S}$ and $\overline{C}$ may therefore be represented by the Boolean functions $$S=\overline{A1+A2}+C$$

$$C=A1\overline{A2}$$

This is correct since one then has

| A1 | A2 | S | C |
|----|----|----|----|
| ∅ | ∅ | ∅ | ∅ |
| ∅ | 1 | 1 | ∅ |
| 1 | ∅ | 1 | ∅ |
| 1 | 1 | ∅ | 1 | as required.

Adder terminal A1 is connected to the commoned drain electrodes 4 of switches S6∅ to S67 (FIG. 2) which are associated to RAM and ROM. Adder terminal A2 is constituted by the output of switch S83 which is controlled by R, $\overline{R}$ and to the input of which the output 2′ of MSFF is connected via OR1 and NAND1 in series. More particularly, the inputs of OR1 are connected to the output 2′ or $\overline{Q}$ of MSFF and to $\overline{SB\emptyset}$ and its output is connected to one input of NAND1 whose other input is connected to terminal $\overline{C}$ of HA via S82 which is controlled by W, $\overline{W}$. When calling $\overline{Q}$ the signal at terminal 2′ of MSFF the signal applied to A2 may be written:

$$A_2 = C + Q.SB\emptyset$$

Drain electrode 4 of S82 is also connected to one input of NOR2 whose other inputs are controlled by $\overline{SB6}$ and $\overline{W}$ so that the output signal of NOR2 which is applied to the commoned inputs 4 of TFF∅ and TFF7 may be written:

$$NOR2 = C.W.SB6.$$

The RAM (FIG. 2) includes 8 rows of 8 cells RAMC∅∅/∅7 to RAMC7∅/77 associated to the inputs IN1 to IN∅ respectively and able to be selected by the select input signals SIN1, $\overline{SIN1}$ to SIN∅, $\overline{SIN\emptyset}$ respectively. The purpose of the first 7 cells of each of these rows is to store the time which has still to elapse before the corresponding input signal is completely debounced, whilst the aim of the eighth cell is to store a so-called overflow bit 1 when the contents of the other cells are all 0. Each of the cells is of the same type and therefore only RAMC∅∅ is shown in FIG. 6. It comprises the cascade connection of switches S94 and S95, inverters I13 and I14 and switch S96, the inverters I13 and I14 and switch S97 being connected in a loop. It has select inputs 1′, 2′, data input 3′, data output 4′ and control inputs 5′, 6′ and 7′, 8′ which are constituted by the gate electrodes of S95 and S96, the source electrode of S94, the drain electrode of S96, and the gate electrodes of S97 and S94 respectively. The control inputs 1′ and 2′ are controlled by the select input signals SIN1 and $\overline{SIN1}$ respectively; the control inputs 5′ and 6′ are controlled by the read signals R and $\overline{R}$ respectively; and the control inputs 7′ and 8′ are controlled by the write signals W and $\overline{W}$ respectively.

When a cell is not selected the switches S95 and S96 are open and the state of the signal stored in the parasitic capacitances of 13, 14 is circulated in the loop I13, I14, S97 each time S97 is closed by R=1. However, when the cell is selected, i.e. when S95 and S96 are closed, the state stored in the cell appears at output terminal 4′ via S96 at the moment is is circulated via S97 when the read pulse R is activated. Also, when the cell is selected a state applied to input 3′ is stored therein via S94 and S95 when the write pulse W is activated.

The RAM output switches S3∅ and S36, the RAM regeneration switches S4∅ to S46, the RAM input switches S5∅ to S56 and the RAM/ROM output switches S6∅ and S66 are associated to the columns of cells RAMC∅∅/7∅ to RAMC∅6/76 respectively, whilst the RAM regeneration switch S47 and the RAM input switch S57 are associated to the column of cells RAMC∅7/77. A logic ∅ is continuously applied to input 3 of a further RAM/ROM output switch S67. The inputs 1 and 2 of S30/36 are controlled by the signals $\overline{NOR3}$ and $NOR3 = Q.\overline{P}$ provided at the output of I5 and of NOR3 respectively. The inputs of NOR3 are connected to the output 2′ or $\overline{Q}$ of MSFF and to output P or 4 of the cells of the column RAMC∅7/77. The inputs 1 and 2 of S4∅/47, S5∅/57 and S60/67 are controlled by the select bit signals $\overline{SB\emptyset/7}$ and SB∅/7. The common drain electrodes 4 of the cells of the columns RAMC∅∅/7∅ to RAMC∅6/76 are connected to the adder input A1 of HA via S3∅ to S36, S6∅ to S66 and S85 in cascade, S85 being controlled by R and $\overline{R}$, and the outputs 4 of the cells of the columns RAMC∅∅/7∅ to RAMC∅7/77 are connected back to the inputs 3 of these cells via S4∅ to S47 respectively. The inverse sum output $\overline{S}$ of HA is connected to the inputs 3 of the cells of the columns RAMC∅∅/7∅ to RAMC∅7/77 via S84 controlled by W, $\overline{W}$, inverter I4, and switches S5∅ to S57.

The ROM (FIGS. 3, 8) includes 8 rows of 7 cells ROMC∅∅/∅6 to ROMC7∅/76 associated to the inputs IN1 to IN∅ respectively. Each of these cells is of the same type and therefore only ROMC∅∅ is shown in FIG. 7. It is constituted by a switch S having control terminals 1, 2 controlled by the select input signals $\overline{SIN1}$, SIN1, input 3 and output 4. The 8 rows are able to be selected by the select input signals SIN1, $\overline{SIN1}$ to SIN0, $\overline{SIN0}$ respectively and their purpose is to store the time during which the corresponding input signal has to be debounced. A each row contains 7 bits a value x between 0 and 127 may be stored therein and because the corresponding row of the RAM is scanned every 2 milliseconds this value corresponds to 2x milliseconds. To permit adding instead of subtraction the complement to 127 of the debouncing value, is stored. More particularly when calling B0 to B6 the bits stored in each row, with B0 and B6 being the lowest and most significant bit respectively, the contents of the ROM are as follows: a 0 or a 1 being stored in a cell when the input 3 thereof is 0 or 1 respectively.

| ROW | B6 | B5 | B4 | B3 | B2 | B1 | B0 | value | time (ms) |
|---|---|---|---|---|---|---|---|---|---|
| 0 | 1 | 0 | 1 | 0 | 1 | 0 | 0 | 84 | 88 |
|   | 1 | 1 | 1 | 1 | 0 | 0 | 0 | 120 | 16 |
|   | 1 | 1 | 1 | 1 | 1 | 0 | 0 | 124 | 8 |
|   | 1 | 1 | 1 | 0 | 1 | 0 | 0 | 116 | 24 |
| 1 | 1 | 1 | 0 | 1 | 1 | 0 | 0 | 108 | 70 |
| 2 | 1 | 1 | 1 | 1 | 1 | 0 | 0 | 124 | 8 |
| 3 | 0 | 1 | 1 | 0 | 1 | 0 | 1 | 53 | 150 |
| 4 | 1 | 1 | 1 | 1 | 1 | 0 | 0 | 124 | 8 |
| 5 | 1 | 1 | 1 | 1 | 1 | 0 | 0 | 124 | 8 |
| 6 | 1 | 1 | 1 | 1 | 1 | 0 | 0 | 124 | 8 |
| 7 | 1 | 1 | 1 | 1 | 1 | 0 | 0 | 124 | 8 |

The time value in milliseconds in the last column is obtained by taking the complement to 127 of the value in the penultimate column, adding 1 to it and multiplying the sum by 2.

Figure 8:
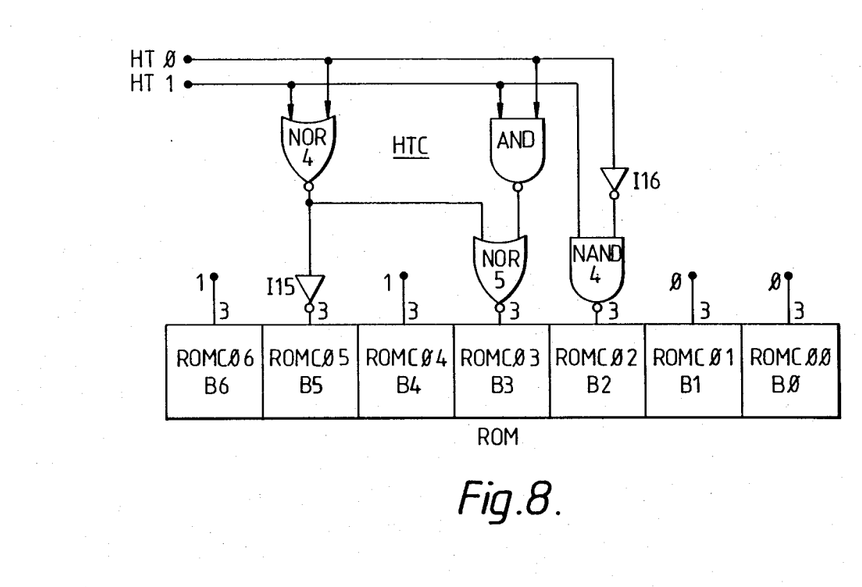
FIG. 8 shows the upper row of ROM of FIG. 2 and an associated control circuit HTC also forming part of the system according to the invention.

With regard to the above table it should be noted that the contents of rows 1 to 7 are fixed, whereas those of row 0 may be changed by the circuit HTC (FIG. 8) controlled by bits HT0 and HT1 received from an outside control circuit. HTC includes the gates AND, NOR4, NOR5 and NAND4 and the inverters I15 and I16, all interconnected as shown so that the following signals appear at the outputs of NAND4, NOR5 and I5 respectively:

NAND4=HT0+$\overline{HT1}$

NOR5=HT0.$\overline{HT1}$+$\overline{HT0}$.HT1

I5=HT0+HT1

These signals are applied to the terminals 3 of ROMC02, ROMC03 and ROMC05 respectively; the terminals 3 of ROMC00 and ROMC01 are connected to logic 0, whilst those of ROMC04 and ROMC06 are connected to logic 1.

The ROM output switches S70 to S76 and the RAM/ROM output switches S60 to S66 are associated to the columns of cells ROMC0/70 to ROMC06/76 respectively. The common inputs 1 and the common inputs 2 of S70 to S76 are connected to the inputs 2 and 1 of S30 to S36 and the common outputs 4 of the cells of the columns ROMC00/07 to ROMC06/76 are connected to the adder input A1 and HA via S70 to S77, to S67 and S85 in cascade.

The operation of the debouncing system is described in detail hereinafter.

From the above and from FIG. 9 it follows that each of the select input time intervals SIN0 to SIN7 comprises 8 select bit periods SB0 to SB7 and that each such bit period SB0/7 starts before the occurrence of the leading edge of a read pulse R and ends after the trailing edge of the write pulse W which immediately follows the latter pulse R.

Because the 8 input signals are processed in the same way only input signal IN0 applied to the like named input terminal IN0 during every input time interval SIN0, having a repetition period of 2 milliseconds, is considered in detail. The binary debouncing value stored in ROMC06 to ROMC00 associated to IN0 is supposed to be 1111100, whilst the binary value stored in RAMC07 to RAMC00 also associated to IN0 is supposed to be arbitrary. The former binary debouncing value has the decimal value 124 and corresponds to a debouncing time of 8 milliseconds.

It is first assumed that the overflow bit stored in the cell RAMC07 is 0 so that the output signal P at the joining outputs 4 of the cells RAM07/77 is on 0 during each time interval wherein IN0 is processed. As a consequence the output signal Q.$\overline{P}$ of NOR3 (FIG. 2) is then equal to Q so that either the output switches S30 to S36 or S70 to S76 are closed depending on Q being 1 or 0 respectively.

Figure 10:
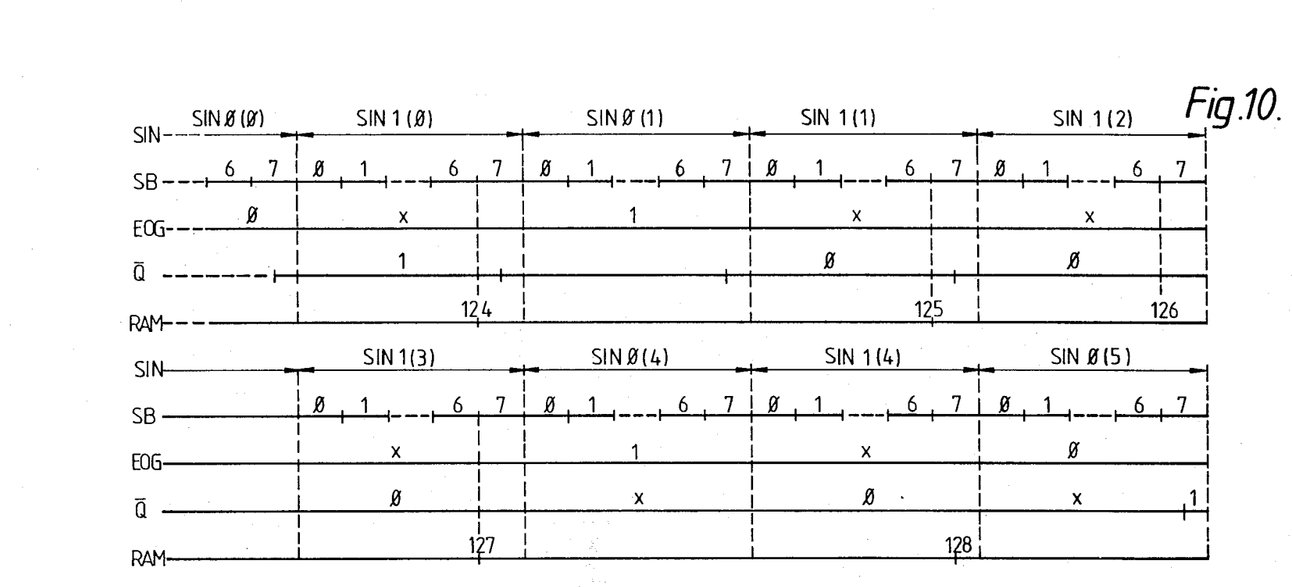
FIGS. 10 and 11 are timing diagrams used to explain the operation of the system of FIGS. 1 to 9.

The input signal IN0 and only this input signal is considered during a plurality of time intervals indicated by SIN0(0), SIN0(1), SIN1(1), SIN1(2), SIN1(3), SIN0(4), SIN1(4) and SIN0(5) in FIG. 10 and represented adjacent each other although the repetition period of SIN0 as well as of SIN1 is equal to 2 milliseconds. In FIG. 10, x means "without importance".

SIN0(0) i.e. a first SIN0

SB0 to SB6: the present and previous states of IN0 are compared in EOG and it is supposed that these states are equal so that the output signal of EOG is 0;

SB7: at the end of this period, when signal B becomes 1 the output signal 0 of EOG is written in MSFF so that the output 2' or $\overline{Q}$ thereof becomes or remains on 1. As a consequence the output switches S30 to S36 and S70 to S76 are open and closed respectively;

SIN1(0) i.e. a first SIN1

SB0:
when a pulse R becomes 1 shortly after the start of SB0, as shown in FIG. 9:
the bit stored in cell RAMC00 (selected by SIN1) is read out and then stored again in this cell via regeneration switch S40 (selected by SB0). This renewed storage is necessary because the time for which data is memorized in a RAM cell is about equal to the cell scanning period of 2 milliseconds;
the bit 0 stored in cell ROMC00 (selected by SIN1) is applied to the adder input A1 of HA via ROM output switch S70 (selected by NOR3), RAM/ROM output switch S60 (selected by SB0) and S85 (closed by R=1);
the bit C+Q.SB0 applied to adder input A2 through OR1; NAND1, S83 is equal to 0 because the previous C=0 (as will become clear later), Q=0 and SB0=1. Because A1=A2=0 one has S=1 and $\overline{C}$=1.

when write pulse W becomes 1, near the end of SB0, as shown in FIG. 9:
the new $\overline{C}$=1 is applied via S82 (closed by W=1) to NAND1 to be used in a following adding operation and to NOR2. The output signal C.W.SB6 of this NOR gate is on 0 because SB6=0;
the signal $\overline{S}$=1 is applied via S84 (closed by W=1), I4 and input switch S50 (selected by SB0) to RAMC00 so that S=0 is written in this cell.

From the above it follows that during SB0 of SIN1(0) a 0 is added to the bit 0 stored in ROMC00, and that the sum 0 thus obtained is stored in RAMC00. In other words the bit stored in ROMC00 is copied in RAMC00.

SB1 to SB6

The same happens during these bit periods so that at the end of SB6 the contents of the row of cells RAMC06 to RAMC00 are 1 1 1 1 1 0 0 or 124 (see first line RAM in FIG. 10).

SB7

During this bit period the operation is again similar to that for the other periods, but now a fixed bit 0 instead of a bit stored in a ROM cell is applied to input A1 of HA via S67 and the sum S=0 of this bit and the previous carry bit C=0 stored as an overflow bit in RAMC07. The contents of RAMC07 to RAMC00 of row 0 of the RAM are therefore 0 1 1 1 1 1 0 0.

Because during the last adding operation A1 is always 0 the last new carry bit obtained during SB7 is always 0. This is the reason why C was equal to 0 during the above consideration SB0.

SIN0 (1) i.e. a second SIN0

SB0 to SB7: the present and previous states of IN0 are compared in EOG and it is supposed that the output signal of EOG is now 1;

SB7: the output 1 of EOG is written in MSFF so that the output $\overline{Q}$ thereof becomes 0. As a consequence the switches output S30 to S36 and S70 to S76 are closed and open respectively.

SIN1(1) i.e. a second SIN1

SB0 when read pulse R becomes 1:
 the bit 0 stored in RAMC00 is read out and then again stored in this cell via regeneration switch S40, on the one hand, and applied to the adder input A1 of HA via S30, S60, and S85, on the other hand;
 the bit C+Q.SB0 is applied to adder input A2 through OR1, NAND1 and S83. Because C=0, Q=1 and SB0=1 the adder input A2 is on 1 and since A1=0 one has S=1 and C=0 or S=0 and $\overline{C}=1$;

when write pulse W becomes 1:
 $\overline{C}=1$ is applied via S82 to NAND1 to be used in a following adding operation;
 S=1 written in RAMC00 via S84, I4 and S50.

From the above it follows that during SB0 a 1 is added to bit 0 stored in RAMC00 and that the sum thus obtained is stored in RAMC00.

SB1 to SB7

During these bit periods the operation is similar to the one described above in case Q=0 since all successive carry bits are 0. At the end of the input time interval SIN0(2) the contents of the cells RAMC07 to RAMC00 are 0 1 1 1 1 1 0 1 or 125 (see line RAM in FIG. 10). This means that by making use of HA a 1 has been serially added to the complementary debouncing value stored in these cells.

SIN1(2) i.e. a third SIN1

The value stored in row 0 of the RAM is changed to 0 1 1 1 1 1 1 0 or 126

SIN1(3) i.e. a fourth SIN1

This value is changed to 0 1 1 1 1 1 1 1 or 127

SIN0(4) i.e. a fifth SIN0

This is only to show that the output of EOG is still on 1.

SIN1(4) i.e. a fifth SIN1

SB0 to SB5

The bits stored in RAMC00 to RAMC05 are all changed to 0.

SB6

The bit stored in RAMC06 is also changed to 0. Indeed, bit 1 stored in this cell is applied to adder input A1 of HA to the other input A2 of which the signal C+Q.SB0=1 is supplied. The latter signal is 1 because C is 1 due to the fact that during SB5 a 1 was added to a 1 and since SB0=0. As a consequence S=1 and C=0 so that S=0 is registered in RAMC06 and $\overline{C}=0$ is applied via SB2 to NAND1 and NOR2. The contents of RAMC06 to RAMC00 are then 0 0 0 0 0 0 0 indicating that a time interval equal to the debouncing time interval of 8 milliseconds has elapsed since the new state of IN0 was registered in MSFF at the end of SIN0(1):

The output signal C.W.SB6 or NOR2 becomes 1 when W=1 so that the toggle flipflop TFF0 is then toggled. Thus the new state of IN0 is accepted and registered.

SB7

During this bit period, bit 0 continuously applied to S67 is fed to adder input A1 of HA to the other input A2 of which the signal C+Q.SB0 is applied. As a consequence $\overline{S}=0$ and C=1 is registered in RAMC07 as an overflow bit and that C=1 is applied via S82 to NAND1. The contents of RAMC07 to RAMC00 are hence equal to 1 0 0 0 0 0 0 0 or 128. In this way, the fact that a debouncing operation has been finished is memorized in RAMC07. As a consequence, the output signal $Q.\overline{P}$ of NOR3 becomes 0 so that the output switches S30 to S36 and S70 to S76 are now open and closed respectively.

SIN0(5) i.e. a sixth SIN0

Because TFF0 has been basculated the output of EOG becomes 0 and during SB7 the output $\overline{Q}$ of MSFF becomes 1, just as during SIN0(0).

SIN1(5) i.e. a sixth SIN1

The contents 124 of the ROM are registered in the RAM, just as during SIN1(0).

In the above it was supposed that the state of IN0, after its change was detected by EOG and registered in MSFF during SIN0(1) remained unchanged so that when TFF0 was basculated Q became 1 [SIN0(5)] and the contents of row 0 of the ROM were copied in row 0 of the RAM [SIN1(5)].

Figure 11:
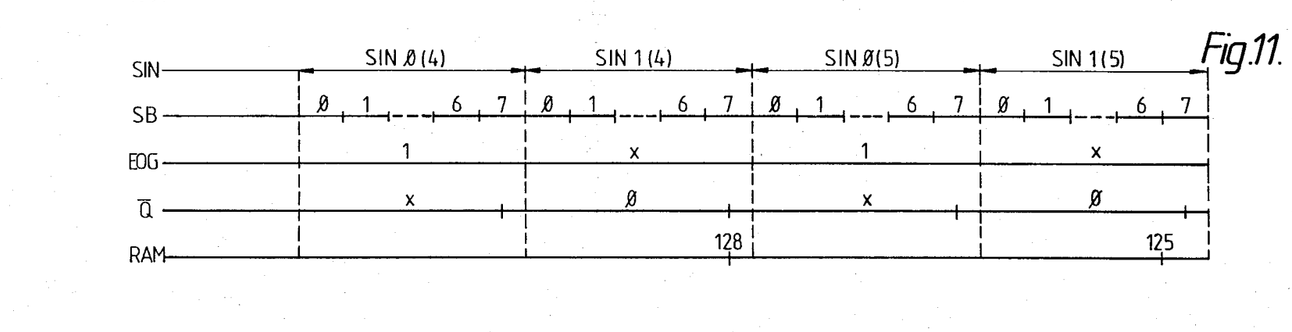

It is now supposed that after the output signal of EOG has been registered in MSFF during SIN0(4), as shown in FIG. 11, the state of the input signal IN0 changes. In this case the following happens:

SIN1(4)

The operations are similar to those described in relation to FIG. 10, i.e.

TFF0 is toggled;
128 is registered in row 0 of the RAM so that an overflow bit is registered in RAMC07.

SIN0(5)

The output of EOG becomes 1 because of the change of IN∅ and TFF∅ and this 1 is registered in MSFF at the end of this time interval so that $\overline{Q}=\emptyset$.

SIN1(5)

During this time interval a 1 is added to the contents 1 1 1 1 ∅ ∅ of row ∅ of the ROM and the result 1 1 1 1 1 ∅ 1 or 125 is registered in row ∅ of the RAM. A value of 125 is registered in order to be in the same conditions as in FIG. 10.

In the fact that the debouncing time has elapsed were not memorized by means of the overflow bit 1 then the operation described above for Q=1 would be continued so that during successive time intervals 1's would be added to the value 128 until again the same end value would be reached. In other words instead of counting a debouncing time of 8 milliseconds, a debouncing time increased by $128\times2\times2=512$ milliseconds would be counted.

While the principles of the invention have been described above in connection with specific apparatus and modifications thereof, it is to be clearly understood that this description is made only by way of example and not as a limitation on the scope of the invention.

We claim:

1. A signal persistence recognition system for changing binary-valued output signals only after a change in corresponding binary-valued input signals has persisted for at least a predetermined time interval, said system comprising:

scanning means for periodically outputting a binary-valued signal representation of the state of each specified one of a plurality of said input signals;

first memory means for storing and outputting a plurality of binary output values each representative of the state of a different specified one of said output signals;

first gating means responsive to outputs from said scanning means and said first memory means for outputting a first control signal indicating whether or not the binary-valued signal output by said scanning means for a specified one of said input signals is equivalent to the binary value output by said first memory means representative of a corresponding one of said output signals;

second memory means for storing and outputting a respective initial value representative of the duration of said predetermined time interval for each of said input signals;

third memory means for inputting, storing and outputting for each specified one of said input sginals, respective input data including a respective count value corresponding to the elapsed time since the state of said each specified input signal last changed state without any change in the corresponding output signal and a respective control bit indicative of whether said predetermined time limit has already elapsed; and processing means responsive to the count value and the control bit output by said third memory means, to the output of said second memory means, and to said first control signal output by said first gating means for, when said first control signal indicates a difference between corresponding specified ones of said input and output signals, and said control bit does not indicate that the respective said predetermined interval had already elapsed, in the event said count value corresponds to an elapsed time equal to said respective predetermined time interval, setting the respective control bit stored in said third memory means and toggling the respective binary output value stored in said first memory means or, in the event said respective predetermined time interval has not yet reached, incrementing the respective sad count value without setting the respective control bit and without toggling the respective binary output value stored in said first memory means and for, when said first control signal indicates no difference between corresponding specified ones of said input and outut signals replacing said respective count value stored in said third memory means with said initial value stored in said second memory means, and resetting said respective control bit.

2. A signal persistence recognition system according to claim 1, wherein said input signals represent the respective signal states of a telecommunication line.

3. An integrated circuit chip comprising the signal persistence recognition system of claim 1.

4. A signal persistence recognition system for changing binary-valued output signals only after a change in corresponding binary-valued input signals has persisted for at least a predetermined time interval, said system comprising:

scanning means for periodically outputting a binary-valued signal representation of the state of each specified one of a plurality of said input signals;

first memory means for storing and outputting a plurality of binary output values each representative of the state of a different specified one of said output signals;

first gating means responsive to outputs from said scanning means and said first memory means for outputting a first control signal indicating whether or not the binary-valued signal output by said scanning means for a specified one of said input signals is equivalent to the binary value output by said first memory means representative of a corresponding one of said output signals;

second memory means for storing and outputting a respective multi-bit initial value representative of the duration of said predetermined time interval for each of said input signals;

third memory means for inputting, storing and outputting for each specified one of said input signals, respective input data including a respective multi-bit count value corresponding to the elapsed time since the state of said each specified input signal last changed state without any change in the corresponding output signal and a respective control bit indicative of whether said predetermined time limit has already elapsed; and processing means responsive to the count value and the control bit output by said third memory means, to the output of said second memory means, and to said first control signal output by said first gating means for, when said first control signal indicates a difference between corresponding specified ones of said input and output signals, and said control bit does not indicate that the respective said predetermined interval had already elapsed, in the event said count value corresponds to an elapsed time equal to said respective predetermined time interval, setting the respective control bit stored in said third memory means and toggling the respective binary output value stored in said first memory means or, in the event said respective predetermined time interval has not yet been reached, incrementing the respective said count value without setting the respective control bit and without toggling the respective binary output value stored in said first memory means and for, when said first control signal indicates no difference between corresponding specified ones of said input and output signals replacing said respective count value stored in said second memory means with said initial value stored in said second memory means, and resetting said respective control bit, said processing means comprising an adder circuit having a first adder input, a second adder input, a sum output and a carry output, second gating means responsive to said first control signal and to said control bit for coupling either an output of said second memory means or an output of said third memory means to said first adder input, clock means for generating a first timing signal, and third gating means responsive to said carry output, to said first control signal and to said first timing signal for causing said adder sum output to be incremented serially relative to said first adder input if and only if said first control signal indicates that the specified input signal is different from the corresponding output signal.

5. A signal persistence recognition system according to claim 4, wherein:

said first memory means comprises a first plurality of toggle flipflops for storing respective ones of said plurality of binary output values, and said clock means generates read and write signals and a plurality of timing signals, and said processing means further comprises:

a fourth gating means, responsive to said carry output, to a write signal and to a second timing signal generated by said clock means, for causing a corresponding one of said plurality of toggle flipflops to toggle when said adder produces an overflow condition.

6. A signal persistence recognition system according to claim 5 wherein said scanning means further comprises a first multiplexer, to the respective inputs of which said input signals are applied, and said first memory means further comprises a second multiplexer whose respective inputs are coupled to the corresponding outputs of said plurality of flipflops, the outputs of said first and second multiplexers being coupled to respective inputs of said first gating means.

7. A signal persistence recognition system according to claim 6, wherein said clock means includes a timing circuit which generates a plurality of successive time interval signals, allocated to respective ones of said input signals, for controlling said first and second multiplexers, said timing circuit generating for each such time interval signal a series of successive bit period signals successively allocated to respective ones of said bits of said multi-bit count value and to said control bit.

8. A signal persistence recognition system according to claim 7, said adder circuit is a 1-bit adder able to add a 0 or a 1 to the initial or count values respectively stored in said second and said third memory means, and that said first and second timing signals are the first and penultimate bit period signals of said series of said first bit period signals and are respectively allocated to the first and last bits of said count value stored in said third memory means, and that the last bit period signal of said series of said bit period signals is allocated to said control bit.

9. A signal persistence recognition system according to claim 8, wherein during said last bit period signal a 0 is applied to said first adder input.

10. A signal persistence recognition system according to claim 4 wherein said first gating means comprises an exclusive or gate and a bistate device, the output of said exclusive or gate being coupled to an input of said bistate device for providing said first contrl signal.

11. A signal persistence recognition system according to claim 5, wherein each of said toggle flipflops includes a first and a second loop, said first loop comprising the cascade connection of a first switch, a first inverter, a second inverter, a third switch and a third inverter, whilst said second loop comprises the cascade connection of said first and second inverters and of a fourth switch, the junction point of said first and second inverters constituting the output of said each toggle flipflop, said first switch being controlled by a respective one of said time interval signals, said second switch being controlled by an output signal of said fourth gating means and said third and fourth switches being controlled by said read signal.

12. A signal persistence recognition system according to claim 11, wherein said bistate device is a master/slave flipflop including a slave loop and a master loop, said slave loop comprising the cascade connection of a fourth and a fifth inverter and a fifth switch and said master loop comprising the cascade connection of a sixth and a seventh inverter and a sixth switch, and a data input of said master/slave flipflop is connected to the output thereof via the cascade connection of a seventh switch, said fourth and fifth inverters, an eighth switch and said sixth and seventh inverters, said sixth and seventh switches being controlled by a second control signal which is deactivated for substantially said last and first bit period signals and said fifth and eighth switches being controlled by a third control signal which is activated from the end of said last bit period signal for substantially one such time period.

13. A signal persistence recognition system according to claim 12, wherein each memory cell of said third memory means includes a loop comprising the cascade connection of eighth and ninth inverters and a ninth switch, said cell having a data input and a data output which are connected via the cascade connection of tenth and eleventh switches, said eighth and ninth inverters and a twelfth switch and said eleventh and twelfth switches are controlled by a corresponding time interval signal, said ninth switch is controlled by said read signal of each bit period signal and said twelfth switch is controlled by said write signal.

* * * * *

UNITED STATES PATENT AND TRADEMARK OFFICE
CERTIFICATE OF CORRECTION

PATENT NO. : 4,860,230

DATED : August 22, 1989

INVENTOR(S) : D. Sallaerts; M.C.A.R Rahier

It is certified that error appears in the above-identified patent and that said Letters Patent is hereby corrected as shown below:

On the Front Page:

[54] Title; change "SIGNAL RECOGNITION SYSTEM" to -- SIGNAL PERSISTENCE TIME INTERVAL RECOGNITION --.

Abstract, line 19, change "perform" to -- performs --.

In the Drawings

In FIG. 1, between the box labeled "HA" and the box labeled "S82" reverse the indicated direction of flow.

Column 1, line 32, change "count down" to -- countdown --.
Column 1, line 38, change "had" to -- has --.
Column 1, line 39, change "count down" to -- countdown --.
Column 1, line 56, change "has not to" to -- does not have to --.

Column 2, line 65, Change "SBO/7" to -- SBØ/7 --.

Column 3, line 48, change "INO/7" to -- INØ/7 --.
Column 3, line 54, change "$\overline{SIN}$" to -- $\overline{SINØ}$ --.

Column 4, line 3, change "cacade" to -- cascade --.
Column 4, line 35, change "basculated" to -- toggled --.
Column 4, line 38, change "inventors" to -- inverters --.

UNITED STATES PATENT AND TRADEMARK OFFICE
CERTIFICATE OF CORRECTION

PATENT NO. : 4,860,230

DATED : August 22, 1989

INVENTOR(S) : D. Sallaerts; M.C.A.R Rahier

It is certified that error appears in the above-identified patent and that said Letters Patent is hereby corrected as shown below:

```
Column 5, line 5, after "on" delete the comma.
Column 5, line 30, change "S=A1+A2+C" to -- S̄=Ā1+Ā2+C --.
Column 5, line 33, change "C=A1Ā2" to -- C̄= A1.Ā2 --.
Column 5, line 62, change "and" to -- to --.

Column 6, line 8, change "the" to -- these --.
Column 6, line 30, change "is" (first occurrence) to -- it--.
Column 6, line 34, after "S3Ø" change "and" to -- to --.
Column 6, line 37, after "S6Ø" change "and" to -- to --.
Column 6, line 48, change "S60/67" to -- S6Ø/67 --.

Column 7, line 3, change "A each" to -- As each --.
Column 7, line 8, after "value" delete the comma.
Column 7, line 9, change "BO" to -- BØ --.
Column 7, line 10, change "BO" to -- BØ --.
Column 7, Table, change all zeros in table to -- Ø --.
Column 7, line 60, before "to" (third occurrence) insert -- S60 --.
Column 7, line 68, change "traling" to -- trailing --.

Column 8, line 17, change "INO" to -- INØ --.
Column 8, line 22, change "INO" to -- INØ --.
Column 8, line 24, after "SINØ(Ø)," insert -- SIN1(Ø) --.
Column 8, line 30, change "SINØ(0)" to -- SINØ(Ø) --.
Column 8, line 53, change "SBO" to -- SBØ --.
Column 8, line 58, change "S" to -- S̄ --.
```

UNITED STATES PATENT AND TRADEMARK OFFICE
CERTIFICATE OF CORRECTION

PATENT NO. : 4,860,230
DATED : August 22, 1989
INVENTOR(S) : D. Sallaerts; M.C.A.R Rahier It is certified that error appears in the above-identified patent and that said Letters Patent is hereby corrected as shown below:

```
Column 9, line 22, change "consideration" to
          -- considered --.
Column 9, line 43, change "S=∅" to -- S̄=∅ --.
Column 9, line 48, after "S=1" insert -- is --.

Column 10, line 8, change "RAMCO5" to -- RAMC∅5 --.
Column 10, line 17, change "S=1 and C=∅" to
          -- S̄=1 to C̄=∅ --.
Column 10, lines 32,33, change "C=1" to -- C̄=1 --
          (both occurrences).
Column 10, line 44, change "basculated" to -- toggled --.
Column 10, line 54, change "basculated" to -- toggled --.
Column 10, line 54, after "basculated" change "Q" to
          -- Q̄ --.

Column 11, line 1, change "SINO(5)" to -- SIN∅(5) --.
Column 11, line 13, change "In" to -- If --.
```

UNITED STATES PATENT AND TRADEMARK OFFICE
CERTIFICATE OF CORRECTION

PATENT NO. : 4,860,230

DATED : August 22, 1989

INVENTOR(S) : D. Sallaerts; M.C.A.R Rahier

It is certified that error appears in the above-identified patent and that said Letters Patent is hereby corrected as shown below:

```
Column 12, line 11, change "sad" to -- said --.
Column 12, line 17, change "outut" to -- output --.

Column 14, lines 20,21, change "or" to -- OR --
          (both occurrences).
Column 14, line 22, change "contrl" to -- control --.
Column 14, line 26, after "switch," insert
          -- a second switch --.
```

Signed and Sealed this

Twenty-sixth Day of November, 1991

Attest:

HARRY F. MANBECK, JR.

*Attesting Officer*     *Commissioner of Patents and Trademarks*

UNITED STATES PATENT AND TRADEMARK OFFICE
CERTIFICATE OF CORRECTION

PATENT NO. : 4,860,230

DATED : August 22, 1989

INVENTOR(S) : D. Sallaerts; M.C.A.R. Rahier

It is certified that error appears in the above-identified patent and that said Letters Patent is hereby corrected as shown below:

Column 4, line 61, change "$A=\overline{SB\emptyset+SB7.R}$" to

-- $A=\overline{SB\emptyset+SB7}.R$ --.

Signed and Sealed this

Twenty-eighth Day of January, 1992

Attest:

HARRY F. MANBECK, JR.

Attesting Officer     Commissioner of Patents and Trademarks